United States Patent
Shudo

(10) Patent No.: US 11,454,885 B2
(45) Date of Patent: Sep. 27, 2022

(54) IMPRINT APPARATUS AND ARTICLE MANUFACTURING METHOD

(71) Applicant: CANON KABUSHIKI KAISHA, Tokyo (JP)

(72) Inventor: Shinichi Shudo, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 118 days.

(21) Appl. No.: 17/018,210

(22) Filed: Sep. 11, 2020

(65) Prior Publication Data

US 2021/0080827 A1 Mar. 18, 2021

(30) Foreign Application Priority Data

Sep. 17, 2019 (JP) .............................. JP2019-168731

(51) Int. Cl.
*G03F 7/00* (2006.01)
(52) U.S. Cl.
CPC ................... *G03F 7/0002* (2013.01)
(58) Field of Classification Search
CPC .. G03F 7/0002; G03F 7/2012; G03F 7/70916; G03F 7/70933; H01L 21/027
See application file for complete search history.

(56) References Cited

U.S. PATENT DOCUMENTS

2016/0297116 A1* 10/2016 Toyoshima ............. B29C 43/56
2021/0033966 A1 2/2021 Shudo et al.

FOREIGN PATENT DOCUMENTS

JP 2016201485 A 12/2016

* cited by examiner

*Primary Examiner* — Alexander M Weddle
(74) *Attorney, Agent, or Firm* — Carter, DeLuca & Farrell LLP

(57) ABSTRACT

The present invention provides an imprint apparatus for performing an imprint process which forms an imprint material pattern on a substrate by using a mold, including a forming unit arranged around the mold and configured to form an air current that surrounds a space between the mold and the substrate, wherein the forming unit includes a first forming unit and a second forming unit which are independent of each other, and each of the first forming unit and the second forming unit includes an outlet which blows out gas for forming the air current from the side of the mold to the side of the substrate, and the first forming unit and the second forming unit include portions, respectively, which overlap each other in a direction away from the space.

20 Claims, 10 Drawing Sheets

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

As requirements for nanopatterning of semiconductor devices increase, a nanopatterning technique in which a fine uneven pattern formed on a mold is formed onto a substrate by using the mold to form an imprint material on the substrate has gained attention in addition to the conventional lithography technique. The nanopatterning technique is also referred to as an imprint technique, and a fine pattern (structure) on the order of several nm can be formed on a substrate.

In the imprint technique, a photocuring method is employed as one of the methods for curing an imprint material. In the photocuring method, an imprint material is cured by bringing the imprint material supplied onto a shot region on a substrate into contact with a mold and irradiating the imprint material with light in this state. An imprint material pattern is formed on a substrate by separating the mold from the cured imprint material.

In an imprint apparatus that employs the imprint technique, if a particle is present in the space between a mold and a substrate when the mold and an imprint material on the substrate are to be brought into contact, the mold and the substrate will become damaged and a deficient pattern will be formed on the substrate. Hence, gas such as clean dry air is used to form an air current (air curtain) that shields (surrounds) the space between the mold and the substrate to prevent the intrusion of the particle.

In general, an air curtain is formed between a position where an imprint material is supplied onto a substrate and a position where a mold is brought into contact with the imprint material on the substrate. Hence, there is a possibility that the imprint material will vaporize when the imprint material that has been supplied on the substrate passes through the air curtain. Therefore, Japanese Patent Laid-Open No. 2016-201485 proposes a technique to suppress the vaporization of an imprint material on a substrate by reducing the flow rate of the gas forming an air curtain when the imprint material on the substrate is to pass through the air curtain.

Also, in an imprint apparatus, there is known, as a productivity improvement technique, a technique in which an imprint material is supplied to a plurality of shot regions on a substrate at once so that an imprint process will be performed continuously on the plurality of shot regions.

However, if the technique disclosed in Japanese Patent Laid-Open No. 2016-201485 is to be used in a case in which an imprint process is to be continuously performed on a plurality of shot regions on the substrate supplied with an imprint material, the following problem will occur, and it will be disadvantageous for the formation of an imprint material pattern on the substrate. For example, while an imprint process is being performed on a given shot region, an uncured imprint material that has been supplied to another shot region will be exposed to the air curtain, and this uncured imprint material will locally vaporize. In addition, reducing the flow rate of the gas forming the air curtain will increase the possibility that a particle will intrude the space between the mold and the substrate.

SUMMARY OF THE INVENTION

The present invention provides an imprint apparatus advantageous in forming an imprint material pattern.

According to one aspect of the present invention, there is provided an imprint apparatus for performing an imprint process which forms an imprint material pattern on a substrate by using a mold, including a forming unit arranged around the mold and configured to form an air current that surrounds a space between the mold and the substrate, and a control unit configured to control the forming unit when the imprint process is performed continuously on a plurality of shot regions on the substrate supplied with an uncured imprint material, wherein the forming unit includes a first forming unit and a second forming unit which are independent of each other, and each of the first forming unit and the second forming unit includes an outlet which blows out gas for forming the air current from the side of the mold to the side of the substrate, and the first forming unit and the second forming unit include portions, respectively, which overlap each other in a direction away from the space.

Further aspects of the present invention will become apparent from the following description of exemplary embodiments with reference to the attached drawings.

DESCRIPTION OF THE EMBODIMENTS

Figure 1:
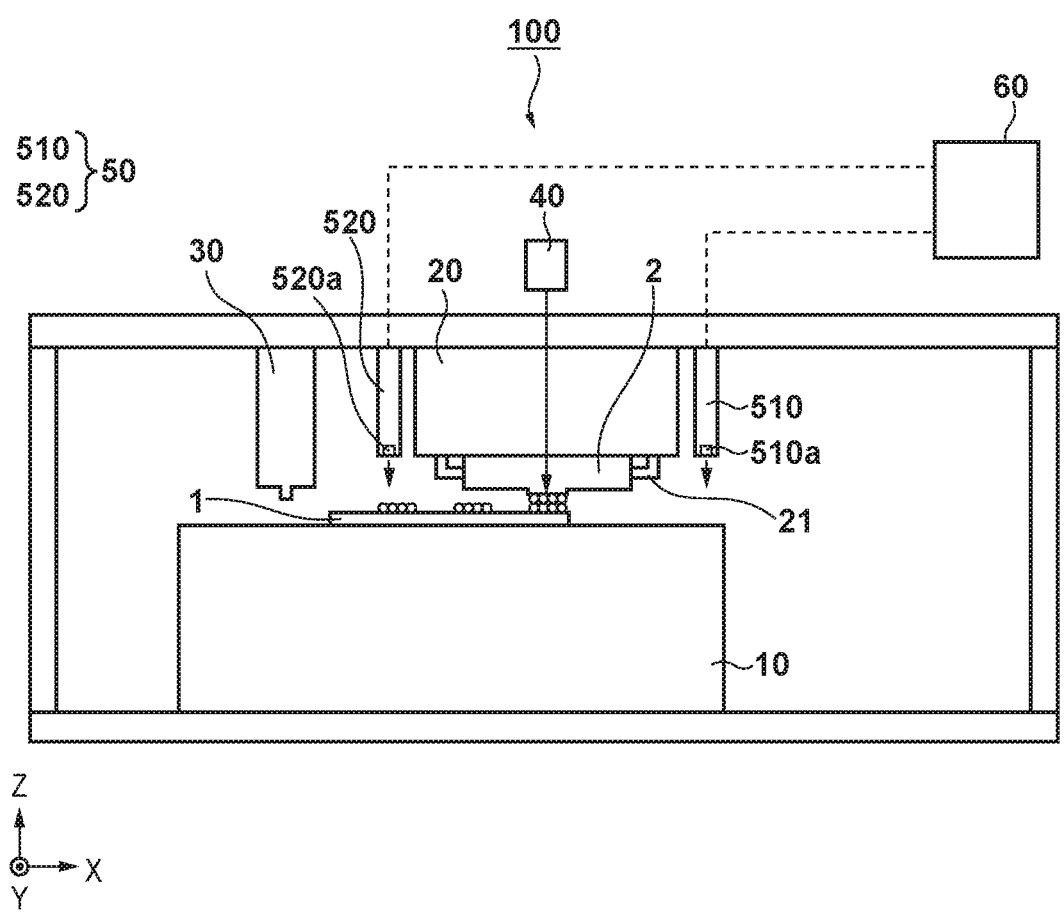
FIG. 1 is a schematic view showing the arrangement of an imprint apparatus as an aspect of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 is a schematic view showing the arrangement of an imprint apparatus 100 according to one aspect of the present invention. The imprint apparatus 100 is a lithography apparatus that performs an imprint process of forming a pattern of an imprint material on a substrate using a mold. The imprint apparatus 100 brings a mold into contact with an uncured imprint material supplied onto (arranged on) a substrate and applies curing energy to the imprint material, thereby forming a pattern of a cured product to which an uneven pattern of the mold is transferred.

As the imprint material, a curable composition (to be also referred to as a resin in an uncured state) to be cured by receiving curing energy is used. Examples of the curing energy are an electromagnetic wave and the like. As the electromagnetic wave, for example, light selected from the wavelength range of 10 nm (inclusive) to 1 mm (inclusive) is used. Examples of the electromagnetic wave are infrared light, a visible light beam, and ultraviolet light.

The curable composition is a composition cured with light irradiation. The photo-curable composition cured by light irradiation contains at least a polymerizable compound and a photopolymerization initiator, and may contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component.

The imprint material may be applied in a film shape onto the substrate by a spin coater (spin coating method) or a slit coater (slit coating method). The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used. A member made of a material different from that of the substrate may be formed on the surface of the substrate, as needed. More specifically, examples of the substrate are a silicon wafer, a semiconductor compound wafer, and silica glass.

In the specification and the accompanying drawings, directions will be indicated on an XYZ coordinate system in which directions parallel to the surface of a substrate 1 are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that is specified based on coordinates on the X-, Y-, and Z-axes, and an orientation is information that is specified by values on the θX-, θY-, and θZ-axes. Positioning means controlling the position and/or orientation.

The imprint apparatus 100 includes a substrate stage 10 that moves while holding the substrate 1, a head 20 that moves while holding a mold 2, and a supplying unit 30 that supplies an uncured imprint material (on a plurality of shot regions) on the substrate. The imprint apparatus 100 includes a shape correction unit 21, an irradiation unit 40, a forming unit 50, and a control unit 60.

The substrate stage 10 and the head 20 form a relative movement mechanism that moves at least one of the substrate 1 and the mold 2 so as to adjust the relative position between the substrate 1 and the mold 2. Adjustment of the relative position between the substrate 1 and the mold 2 by the relative movement mechanism includes driving to bring (press) the imprint material on the substrate 1 into contact with the mold 2 and driving to separate the mold 2 from the cured imprint material on the substrate 1. In addition, adjustment of the relative position between the substrate 1 and the mold 2 by the relative movement mechanism includes positioning between the substrate 1 and the mold 2. The substrate stage 10 is configured to drive the substrate 1 with respect to a plurality of axes (for example, three axes including the X-axis, Y-axis, and θZ-axis, and preferably six axes including the X-axis, Y-axis, Z-axis, θX-axis, θY-axis, and θZ-axis). The head 20 is configured to drive the mold 2 with respect to a plurality of axes (for example, three axes including the X-axis, Y-axis, and θZ-axis, and preferably six axes including the X-axis, Y-axis, Z-axis, θX-axis, θY-axis, and θZ-axis).

The supplying unit 30 includes, for example, a dispenser that discharges the imprint material to each shot region on the substrate. The imprint material is supplied from a tank (not shown), which stores the imprint material, to the supplying unit 30 via a tube (not shown). The imprint material that was not supplied onto the substrate from the supplying unit 30 is collected into the tank via the tube. The supplying unit 30 may also be a cartridge that integrates a tank for storing the imprint material and a nozzle for discharging the imprint material onto the substrate.

The shape correction unit 21 has a function of correcting the shape (magnification) of the mold 2 held by the head 20. The shape correction unit 21 can include, for example, a plurality of fingers that deform the mold 2 by applying a force (applying a pressure) to the side surface of the mold 2 in a direction parallel to the pattern surface (a surface on which a pattern has been formed) of the mold 2.

When the imprint material on the substrate is to be cured, the irradiation unit 40 irradiates the imprint material with light via the mold 2, that is, in a state in which the mold 2 and the imprint material on the substrate are in contact with each other. The irradiation unit 40 includes, for example, a light source (not shown), and an optical system (not shown) that adjusts the light from the light source into light suitable for curing the imprint material.

The forming unit 50 is arranged around the mold 2 and forms an air current, that is, a so-called air curtain that surrounds the space between the substrate 1 and the mold 2. In this embodiment, the forming unit 50 includes a first forming unit 510 and a second forming unit 520 formed independently from each other. The first forming unit 510 includes an outlet 510a that blows out gas for forming an air curtain (air current) from the side of the mold 2 toward the side of the substrate 1 (that is, in the −Z direction). In a similar manner, the second forming unit 520 includes an outlet 520a that blows out gas for forming an air curtain from the side of the mold 2 toward the side of the substrate 1. The gas which is blown out from the first forming unit 510 and the second forming unit 520 includes, for example, clean dry air or the like.

The control unit 60 is formed by an information processing apparatus (computer) that includes a CPU, a memory, and the like, and causes the imprint apparatus 100 to operate by integrally controlling each unit of the imprint apparatus 100 in accordance with a program stored in a storage unit. The control unit 60 controls the imprint process and the processing related to the imprint process. In this embodiment, the control unit 60 also controls the forming unit 50 when the imprint process is to be performed continuously on a plurality of shot regions that have been supplied with an uncured imprint material. More specifically, the control unit 60 individually controls the flow rate of gas blown out from the outlet 510a arranged in the first forming unit 510 and the flow rate of gas blown out from the outlet 520a arranged in the second forming unit 520. Note that although only one control unit 60 has been arranged with respect to the first forming unit 510 and the second forming unit 520 in this embodiment, a separate control unit may be arranged for each of the first forming unit 510 and the second forming unit 520.

The imprint process performed by the imprint apparatus 100 will be described. First, an uncured imprint material is supplied onto shot regions on the substrate by causing the supplying unit 30 to discharge the imprint material in accordance with a drop recipe while the substrate stage 10, which is holding the substrate 1, reciprocally moves below (at the imprint material supplying position of) the supplying unit 30. In this embodiment, the supplying unit 30 supplies the uncured imprint material onto a plurality of shot regions (at least two or more shot regions) on the substrate at once. A shot region that is supplied with the uncured imprint material and is to undergo the imprint process will be referred to as a target shot region hereinafter. In this case, a shot region is a region corresponding to a pattern region (a region on which a pattern has been formed) of the mold 2.

After the uncured imprint material is supplied to the plurality of shot regions on the substrate, the substrate stage 10 which is holding the substrate 1 is moved below (to a pressing position of) the mold 2 held by the head 20. When the target shot region on the substrate has been positioned at the pressing position, a process to bring the uncured imprint material supplied on the target shot region into contact with the mold 2 is started. At this time, the control unit 60 determines, in a state in which the mold 2 is facing the target shot region (at least one shot region), whether an uncured imprint material is present below one of the first forming unit 510 and the second forming unit 520. In other words, the control unit determines whether the outlet 510a arranged in the first forming unit 510 or the outlet 520a of the second forming unit 520 is positioned above the uncured imprint material. If it is determined that the uncured imprint material is present below one forming unit among the first forming unit 510 and the second forming unit 520, the control unit 60 will control the forming unit 50 to reduce the flow rate of the gas blown out from the outlet arranged in the one forming unit. For example, the forming unit 50 is controlled so that the flow rate of gas blown out from the outlet arranged in the one forming unit will be at a flow rate (second flow rate) lower than a flow rate (first flow rate) of gas blown out when the uncured imprint material is not present below the outlet. At this time, in order not to change the air pressure (state) of the space between the mold 2 and the substrate 1, it is preferable to increase the flow rate of gas blown out from the outlet arranged in the other forming unit (the forming unit without the presence of the uncured imprint material below it) among the first forming unit 510 and the second forming unit 520. More specifically, the forming unit 50 is controlled so that the total sum of the flow rate of gas blown out from the outlet 510a arranged in the first forming unit 510 and the flow rate of gas blown out from the outlet 520a arranged in the second forming unit 520 will always be constant. In other words, the reduction in the flow rate of gas blown out from the outlet arranged in one forming unit is compensated by increasing the flow rate of gas blown out from the outlet arranged in the other forming unit. As a result, it will be possible to suppress reduction of the flow rate of the gas forming the air curtain while reducing the flow rate of the gas that is blown out from the outlet arranged in the forming unit in which the uncured imprint material is present below, thereby suppressing the intrusion of particles in the space between the mold 2 and the substrate 1.

Also, there may be a case in which the imprint material to be supplied on the substrate is highly volatile. In this case, the flow rate of gas to be blown out from the outlet arranged in the forming unit in which the uncured imprint material will be present below can be set to zero at the point when the substrate stage 10 is stopped and the head 20 starts the movement to bring the uncured imprint material on the substrate and the mold 2 into contact.

In addition, there may be a case in which the uncured imprint material supplied on the substrate will pass below one forming unit among the first forming unit 510 and the second forming unit 520 during the process in which the substrate stage 10 is moved from the supplying position to the pressing position. In this case, the flow rate of gas to be blown out from the outlet arranged in the one forming unit (the forming unit in which the uncured imprint material will pass below) can be reduced at the point when the movement to position the substrate stage 10 at the pressing position is started.

When the mold 2 and the uncured imprint material supplied on the target shot region on the substrate are to be brought into contact, the shape of the mold 2 can be corrected by the shape correction unit 21 so that (the pattern of) the mold 2 will have a predetermined shape. When the mold 2 and the uncured imprint material supplied on the target shot region on the substrate have been brought into contact, the imprint material is cured via the mold 2 by being irradiated with light from the irradiation unit 40 in this state. Next, the mold 2 is separated from the cured imprint material on the target shot region. As a result, an imprint material pattern is formed on the target shot region on the substrate.

After the mold 2 has been separated from the cured imprint material on the substrate, the substrate stage 10 which is holding the substrate 1 is moved so that the next target shot region on the substrate will be positioned at the pressing position. When the next target shot region on the substrate has been positioned at the pressing position, the process to bring the mold 2 and the uncured imprint material supplied on the next target shot region into contact is started. At this time, the control unit 60 will redetermine, in a state in which the mold 2 is facing the next target shot region, whether the uncured imprint material is present below one forming unit among the first forming unit 510 and the second forming unit 520. If the uncured imprint material is present below one forming unit among the first forming unit 510 and the second forming unit 520, the control unit 60 will maintain the flow rate of the gas blown out from the outlet arranged in the one forming unit at the second flow rate. On the other hand, if the uncured imprint material is not present below one forming unit among the first forming unit 510 and the second forming unit 520, the control unit 60 will reset the flow rate of the gas blown out from the outlet arranged in the one forming unit back to the first flow rate from the second flow rate.

This series of operations can be repeated until the imprint process has been performed on all of the plurality of shot regions that have been supplied with the uncured imprint material at once by the supplying unit 30. Subsequently, when the imprint process on all of the shot regions on the substrate has ended, the substrate 1 is unloaded from the imprint apparatus 100.

Figure 2A:
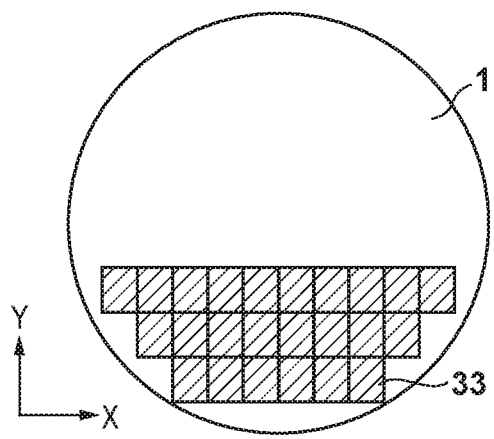
FIGS. 2A to 2D are views for explaining the order of an imprint process.
Figure 2B:
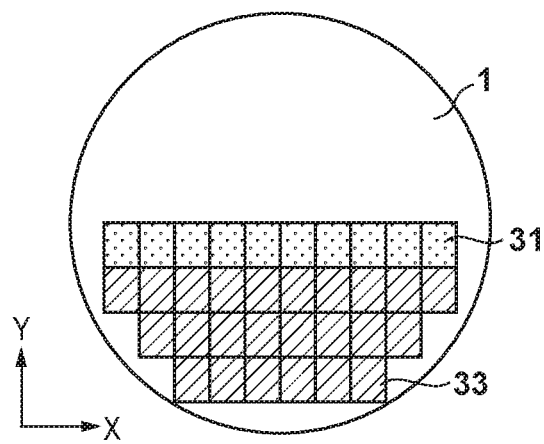
Figure 2C:
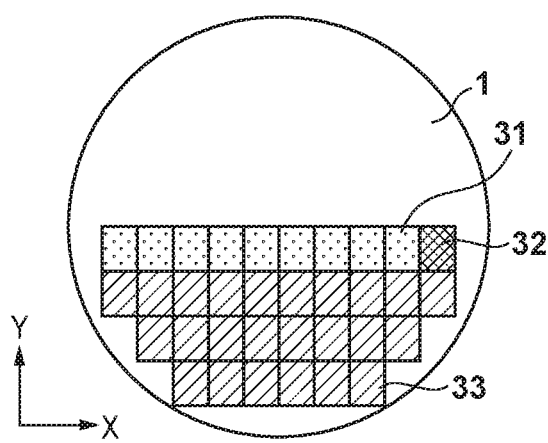
Figure 2D:
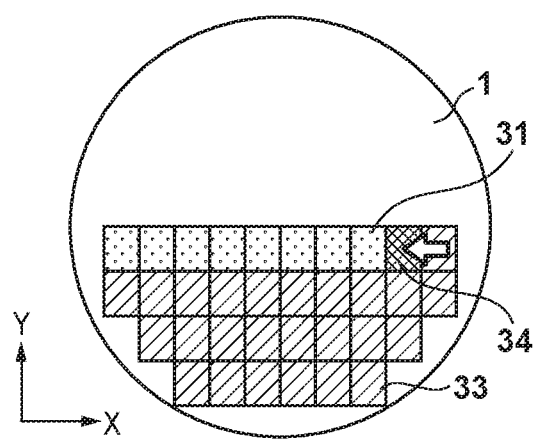

FIGS. 2A, 2B, 2C, and 2D are views for describing the order of the imprint process performed in the imprint apparatus 100, and show a state in which the imprint process is continuously performed on a plurality of shot regions on the substrate. FIG. 2A shows the substrate 1 in a state before the uncured imprint material is supplied onto the substrate. In FIG. 2A, shot regions 33 show shot regions on which an imprint material pattern has been formed by undergoing an imprint process. FIG. 2B shows the substrate 1 in a state after the imprint material has been supplied onto a plurality of shot regions 31 on the substrate. In this embodiment, as shown in FIG. 2B, the uncured imprint material is supplied at once to the plurality of shot regions 31 arranged on the side of +Y direction with respect to the shot regions 33 on which the imprint material pattern has been formed. Also, although the uncured imprint material has been supplied to all of the shot regions 31 included in a single array in the X direction in FIG. 2B, the uncured imprint material may be supplied, for example, to every other shot region by skipping the next shot region after supplying the imprint material to one shot region. FIG. 2C shows the substrate 1 in a state in which the imprint process is performed on one shot region 32 among the plurality of shot regions 31 on the substrate. The mold 2 is pressed against the substrate 1 with the imprint material supplied onto the shot region 32 in between them. As a result, the imprint material supplied on the shot region 32 is formed by the mold 2. FIG. 2D shows the substrate 1 in a state in which the imprint process is performed on a shot region 34 which is adjacent to the shot region 32 among the plurality of shot regions 31 on the substrate. Since the imprint process is to be performed on the shot region 34 following the shot region 32, the substrate stage 10 which is holding the substrate 1 is moved so that the shot region 34 will be positioned at the pressing position. In this embodiment, the order of the imprint process is arranged so that the process will proceed from a shot region on the side of the −Y direction to a shot region on the side of the +Y direction and from a shot region on the side of the +X direction to the side of the −X direction. However, the present invention is not limited to this. For example, the imprint process order may be arranged so that the process will proceed from a shot region on the side of the +Y direction to a shot region on the side of the −Y direction and from a shot region on the side of the −X direction to the side of +X direction. The order of the imprint process can be arbitrarily selected in consideration of the productivity and the arrangement of the imprint apparatus 100.

Figure 3:
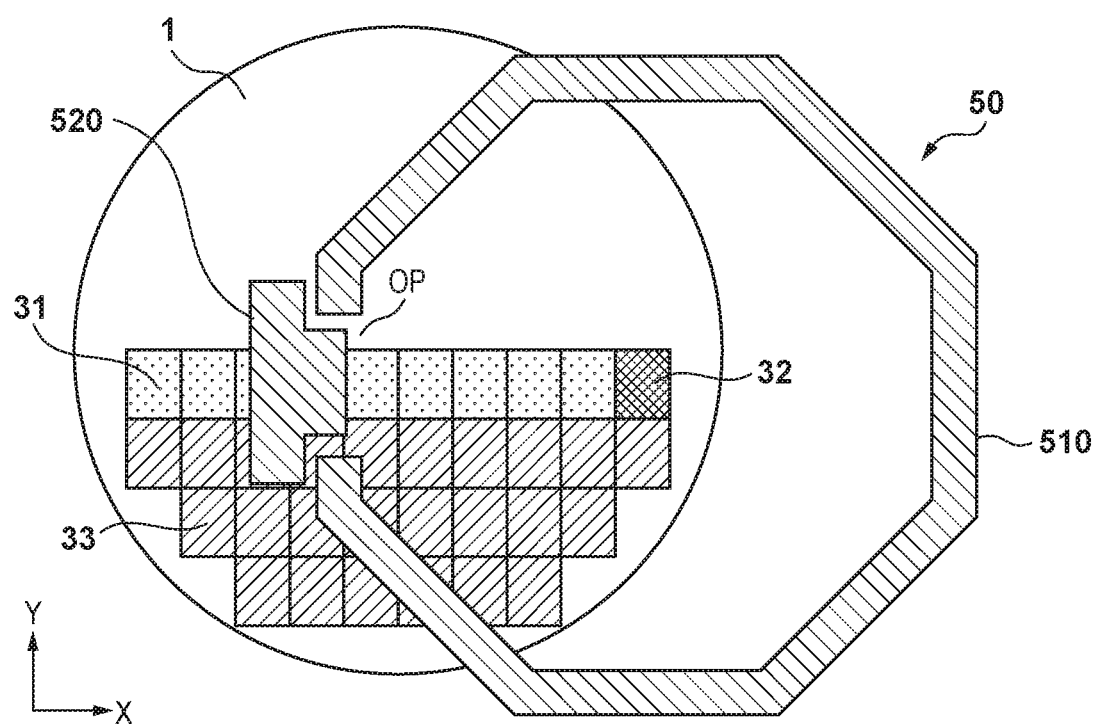
FIG. 3 is a view showing the positional relationship between each shot region on a substrate and a forming unit.

FIG. 3 is a view showing the positional relationship between each shot region on the substrate and the forming unit 50, that is, the first forming unit 510 and the second forming unit 520 in the imprint process according to the embodiment. As shown in FIG. 3, the first forming unit 510 has a shape in which a portion has been cutout from a shape surrounding the mold 2 so as to include an opening OP which partially opens to the mold 2 in the X-Y plane (in the plane parallel to the pattern surface of the mold 2). As shown in FIG. 3, the second forming unit 520 has a shape that covers the opening OP in the X-Y plane. Also, the outlet 510a is arranged on the entire surface of the substrate-side surface of the first forming unit 510, and the outlet 520a is arranged on the entire surface of the substrate-side surface of the second forming unit 520.

Referring to FIG. 3, for example, in a case in which the imprint process is to be performed on the shot region 32 on the substrate, the second forming unit 520 is arranged above the uncured imprint material. In other words, in a state in which the mold 2 is facing the shot region 32 on the substrate, the uncured imprint material supplied onto the plurality of shot regions 31 will be present below the second forming unit 520. Hence, the vaporization of the uncured imprint material supplied onto the shot regions 31 will accelerate during a period from the start to the end of the imprint process because the uncured imprint material will be exposed to the gas blown out from the outlet 520a arranged in the second forming unit 520. Therefore, in this embodiment, the control unit 60 will prevent the acceleration of the vaporization of the uncured imprint material supplied on the shot regions 31 by reducing (restricting) the flow rate of the gas blown out from the outlet 520a arranged in the second forming unit 520 as described above. As a result, the vaporization of the uncured imprint material supplied on the shot regions 31 can be suppressed. Note that as a measure for reducing the flow rate of gas, the flow velocity when the gas blown out from the outlet reaches the uncured imprint material may be arranged to be lower than the speed at which the substrate stage 10 moves while holding the substrate 1. However, since this measure depends on the volatility of the imprint material supplied onto the substrate, the present invention is not limited to this.

The shape and the arrangement of the forming unit 50 according to this embodiment will be described more specifically with reference to FIGS. 4A, 4B, 4C, 4D, 4E, 4F, and 4G.

Figure 4A:
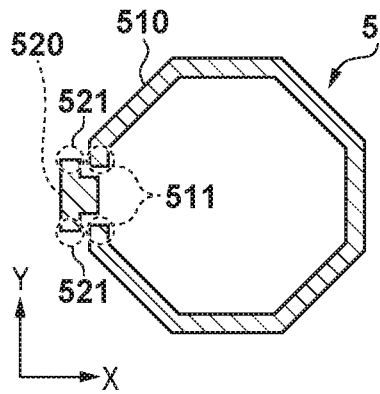
FIGS. 4A to 4G are views for explaining the arrangement and the shape of the forming unit.
Figure 4B:
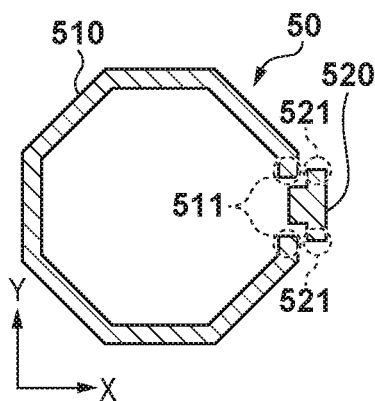
Figure 4C:
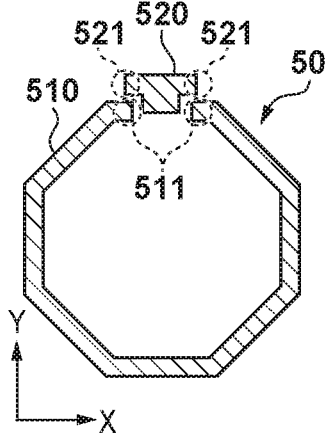
Figure 4D:
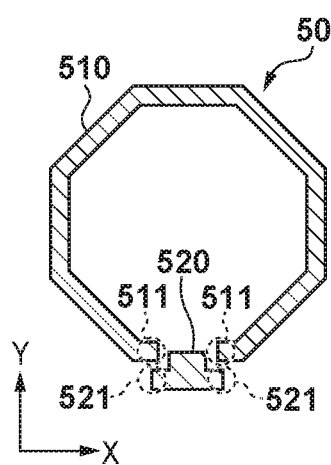

FIGS. 4A and 4B show the arrangement of the forming unit 50 that is suitable for a case in which the imprint process is to be performed continuously after an uncured imprint material is supplied at once to a plurality of shot regions included in a single array in the X direction. FIG. 4A shows the arrangement of the forming unit 50 that is suitable for a case in which the imprint process is to be performed continuously on the plurality of shot regions from the +X direction to the −X direction. FIG. 4B shows the arrangement of the forming unit 50 that is suitable for a case in which the imprint process is to be performed continuously on the plurality of shot regions from the −X direction to the +X direction. FIGS. 4C and 4D show the arrangement of the forming unit 50 that is suitable for a case in which the imprint process is to be performed by supplying the uncured imprint material at once to a plurality of shot regions included in a single array in the Y direction. FIG. 4C shows the arrangement of the forming unit 50 that is suitable for a case in which the imprint process is to be performed continuously on the plurality of shot regions from the −Y direction to the +Y direction. FIG. 4D shows the arrangement of the forming unit 50 that is suitable for a case in which the imprint process is to be performed continuously on the plurality of shot regions from the +Y direction to the −Y direction.

Referring to FIGS. 4A to 4D, each forming unit 50 includes an outlet for blowing out gas to form an air curtain, and includes the first forming unit 510 and the second forming unit 520 which are arranged independently of each other. The first forming unit 510 and the second forming unit 520 include portions 511 and 521, respectively, which overlap each other in a direction away from (the center of) the space between the mold 2 and the substrate 1. Arranging the portions 511 and 521 which overlap each other in the first forming unit 510 and the second forming unit 520, respectively, in this manner will be advantageous in suppressing the intrusion of particles into the space between the mold 2 and the substrate 1.

Figure 4E:
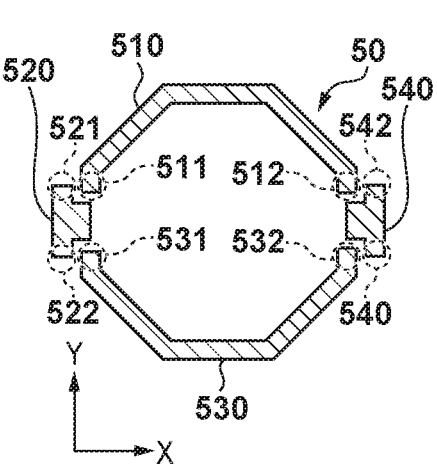
Figure 4F:
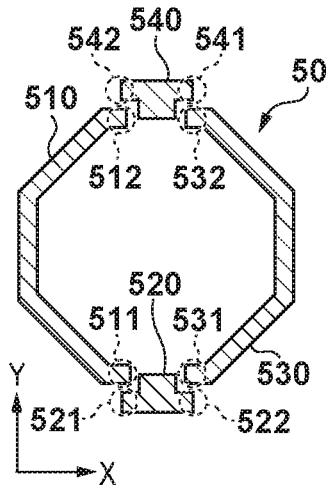

FIG. 4E shows the arrangement of the forming unit 50 that is suitable for a case in which the imprint process is to be performed continuously after an uncured imprint material is supplied at once to a plurality of shot regions included in a single array in the X direction. FIG. 4E shows the arrangement of the forming unit 50 that is suitable for a case in which the imprint process is to be performed continuously on the plurality of shot regions from the +X direction to the −X direction and on the plurality of shot regions from the −X direction to the +X direction. FIG. 4F shows the arrangement of the forming unit 50 that is suitable for a case in which the imprint process is to be performed continuously after an uncured imprint material is supplied at once to a plurality of shot regions included in a single array in the Y direction. FIG. 4F shows the arrangement of the forming unit 50 that is suitable for a case in which the imprint process is to be performed continuously on the plurality of shot regions from the +Y direction to the −Y direction and on the plurality of shot regions from the −Y direction to the +Y direction.

Referring to FIGS. 4E and 4F, each forming unit 50 includes an outlet that blows out gas to form an air curtain, and includes the first forming unit 510, the second forming unit 520, a third forming unit 530, and a fourth forming unit 540 which are arranged independently of each other. The first forming unit 510 and the fourth forming unit 540 include portions 512 and 542, respectively, which overlap each other in a direction away from the space between the mold 2 and the substrate 1. The first forming unit 510 and the second forming unit 520 include the portions 511 and 521, respectively, which overlap each other in a direction away from the space between the mold 2 and the substrate 1. The second forming unit 520 and the third forming unit 530 include portions 522 and 531, respectively, which overlap each other in a direction away from the space between the mold 2 and the substrate 1. The third forming unit 530 and the fourth forming unit 540 include portions 532 and 541, respectively, which overlap each other in a direction away from the space between the mold 2 and the substrate 1. Setting this kind of an arrangement will be advantageous in suppressing the intrusion of particles into the space between the mold 2 and the substrate 1.

Also, as shown in FIGS. 4E and 4F, the first forming unit 510 and the third forming unit 530 are arranged so as to face each other with the mold 2 sandwiched between them, and have the same shape in the X-Y plane (in the plane parallel to the pattern surface of the mold 2). The second forming unit 520 and the fourth forming unit 540 are arranged so as to face each other with the mold 2 sandwiched between them, and have the same shape in the X-Y plane. As a result, the forming unit 50 shown in FIG. 4E will be able to cope with an imprint process order from either of the ±X directions, and the forming unit 50 shown in FIG. 4F will be able to cope with an imprint process order from either of the ±Y directions.

Figure 4G:
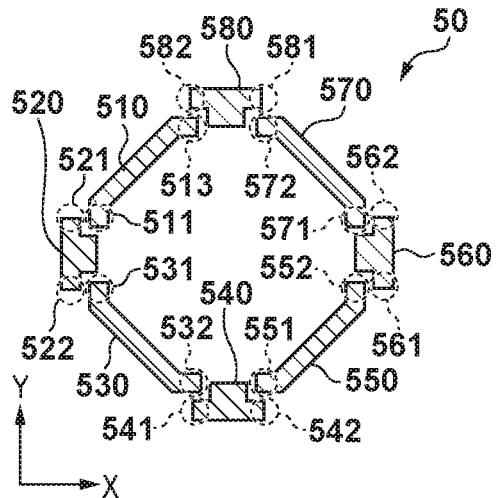

FIG. 4G shows the arrangement of the forming unit 50 that is suitable for a case in which the imprint process is to be performed continuously after an uncured imprint material is supplied at once to a plurality of shot regions included in a single array in the X direction or the Y direction. Referring to FIG. 4G, the forming unit 50 includes the first forming unit 510, the second forming unit 520, the third forming unit 530, the fourth forming unit 540, a fifth forming unit 550, a sixth forming unit 560, a seventh forming unit 570, and an eighth forming unit 580 which are arranged independently from each other. Each of the first forming unit 510, the second forming unit 520, the third forming unit 530, the fourth forming unit 540, the fifth forming unit 550, the sixth forming unit 560, the seventh forming unit 570, and the eighth forming unit 580 includes an outlet that blows out gas to form an air curtain. In addition, the first forming unit 510 and the eighth forming unit 580 include portions 513 and 582, respectively, which overlap each other in a direction away from the space between the mold 2 and the substrate 1. The second forming unit 520 and the third forming unit 530 include the portions 522 and 531, respectively, which overlap each other in a direction away from the space between the mold 2 and the substrate 1. The third forming unit 530 and the fourth forming unit 540 include the portions 532 and 541, respectively, which overlap each other in a direction away from the space between the mold 2 and the substrate 1. The fourth forming unit 540 and the fifth forming unit 550 include portions 542 and 551, respectively, which overlap each other in a direction away from the space between the mold 2 and the substrate 1. The fifth forming unit 550 and the sixth forming unit 560 include portions 552 and 561, respectively, which overlap each other in a direction away from the space between the mold 2 and the substrate 1. The sixth forming unit 560 and the seventh forming unit 570 include portions 562 and 571, respectively, which overlap each other in a direction away from the space between the mold 2 and the substrate 1. The seventh forming unit 570 and the eighth forming unit 580 include portions 572 and 581, respectively, which overlap each other in a direction away from the space between the mold 2 and the substrate 1. It will be possible to physically suppress the intrusion of particles into the space between the mold 2 and the substrate 1 by setting this kind of an arrangement.

Also, as shown in FIG. 4G, the first forming unit 510, the third forming unit 530, the fifth forming unit 550, and the seventh forming unit 570 have the same shape in the X-Y plane. The second forming unit 520, the fourth forming unit 540, the sixth forming unit 560, and the eighth forming unit 580 have the same shape in the X-Y plane. In addition, the first forming unit 510 and the fifth forming unit 550 are arranged so as to face each other with the mold 2 sandwiched between them, and the second forming unit 520 and the sixth forming unit 560 are arranged so as to face each other with the mold 2 sandwiched between them. The third forming unit 530 and the seventh forming unit 570 are arranged so as to face each other with the mold 2 sandwiched between them, and the fourth forming unit 540 and the eighth forming unit 580 are arranged so as to face each other with the mold 2 sandwiched between them. As a result, the forming unit 50 shown in FIG. 4G will be able to cope with an imprint process order from either of the ±X directions and to cope with an imprint process order from either of the ±Y directions.

Note that the arrangement and the shape of the forming unit 50 shown in each of FIGS. 4A, 4B, 4C, 4D, 4E, 4F, and 4G are merely an example. The arrangement and the shape of the forming unit 50 can be determined in accordance with the order and the direction to be used when an imprint process is to be performed continuously by supplying an uncured imprint material on a plurality of shot regions on a substrate at once.

Figure 5A:
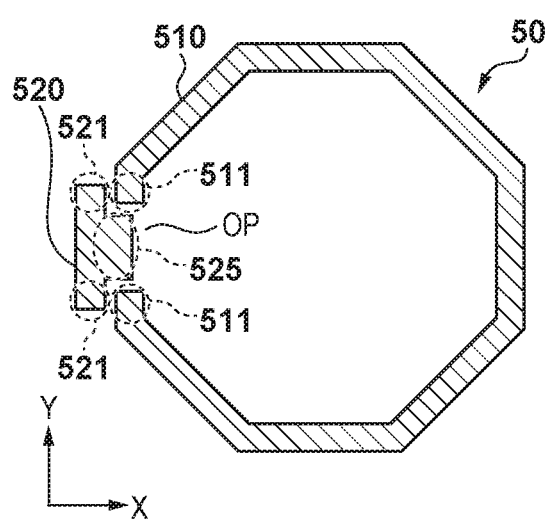
FIGS. 5A to 5D are views showing an example of the shape of the forming unit.
Figure 5B:
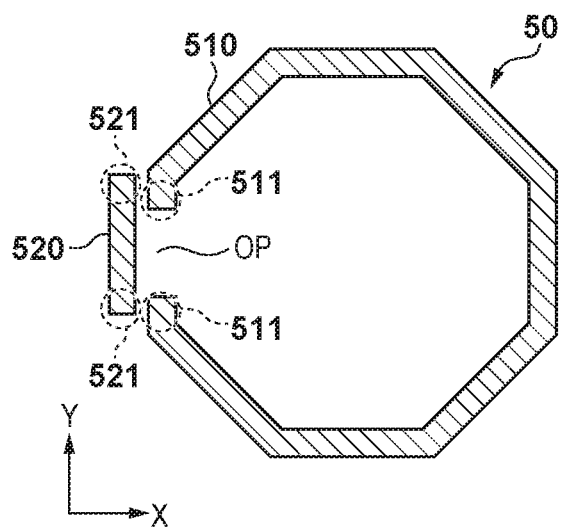
Figure 5C:
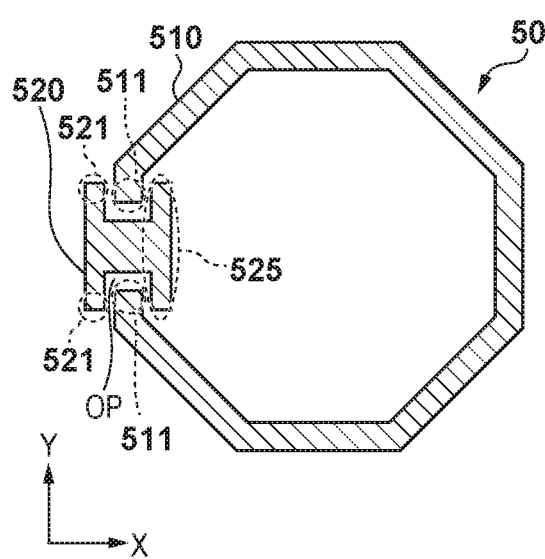

FIGS. 5A, 5B, 5C, and 5D are views showing an example of the shape of the forming unit 50, in particular, the shape of the second forming unit 520 according to this embodiment. As shown in FIGS. 5A and 5C, the second forming unit 520 may include a portion 525 to be inserted into the opening OP of the first forming unit 510. More specifically, the second forming unit 520 may have, in the X-Y plane (in the plane parallel to the pattern surface of the mold 2), a convex shape as shown in FIG. 5A or an H shape as shown in FIG. 5C. It will be possible to physically suppress the intrusion of particles into the space between the mold 2 and the substrate 1 by setting this kind of an arrangement.

Figure 5D:
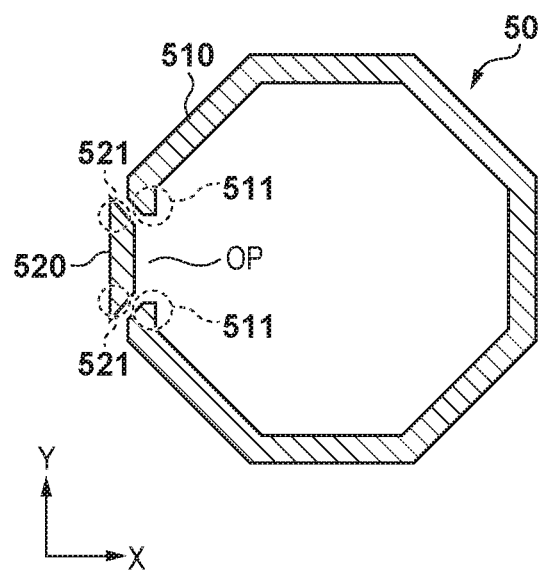

However, the second forming unit 520 need only include the portions 521 that overlap in the direction away from the space between the mold 2 and the substrate 1, and is not always required to include the portion 525 to be inserted in the opening OP of the first forming unit 510. In other words, as shown in FIGS. 5B and 5D, the second forming unit 520 may not include the portion to be inserted in the opening OP of the first forming unit 510. More specifically, the second forming unit 520 may have, in the X-Y plane (in the plane parallel to the pattern surface of the mold 2), an I shape as shown in FIG. 5B or a trapezoidal shape (tapered shape) as shown in FIG. 5D.

The forming unit 50 (the first forming unit 510 and the second forming unit 520) needs form an air curtain to maintain its performance in suppressing the intrusion of particles in the space between the mold 2 and the substrate 1. Hence, each of the first forming unit 510 and the second forming unit 520 includes, as shown in FIGS. 4A to 4D and FIGS. 5A to 5D, the portions 511 and 521 that overlap each other in a direction away from the space between the mold 2 and the substrate 1. Also, the length (dimension) in the Y direction of the second forming unit 520 is longer than the length in the longitudinal direction of one shot region. As a result, it will be possible to suppress the vaporization of the uncured imprint material supplied on the substrate. Also, although the second forming unit 520 is arranged on the outer side of the first forming unit 510 in FIGS. 5A, 5B, and 5D, it may be arranged on the inner side of the first forming unit 510.

Figure 6:
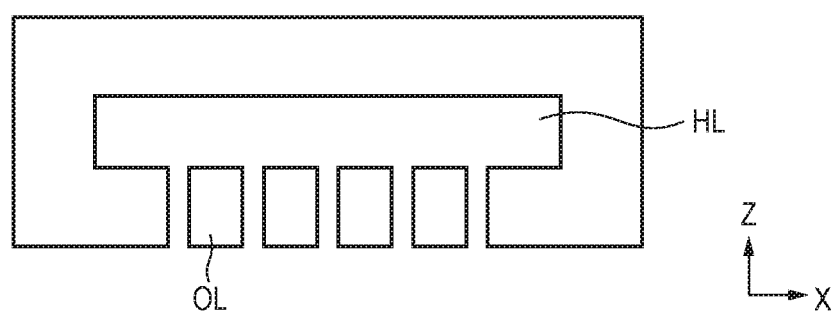
FIG. 6 is a view showing a section of a first forming unit and a second forming unit.

FIG. 6 is a view showing a section of the first forming unit 510 and the second forming unit 520 in the X-Y plane. As shown in FIG. 6, the first forming unit 510 and the second forming unit 520 are arranged by using, as a base, a hollow member which includes a hollow portion HL and forming an outlet OL in the hollow member. The hollow portion HL is connected to a gas source via a supply tube, and the gas supplied from the gas source, that is, the gas to be blown out from the outlet OL is reserved in the hollow portion HL. Arranging the hollow portion HL which can reserve gas in this manner will allow the gas to be blown out from the outlet OL at a uniform pressure. However, the arrangement of the first forming unit 510 and the second forming unit 520 shown in FIG. 6 is merely an example, and the present invention is not limited to this. For example, the first forming unit 510 and the second forming unit 520 may be entirely formed by a porous member, and the porous member may be attached to the hollow member as the outlet OL instead of forming the outlet OL in the hollow member.

In this embodiment, the air pressure change in the space between the mold 2 and the substrate 1 is suppressed by dividing the forming unit 50 into, for example, the first forming unit 510 and the second forming unit 520 so as to surround the mold 2 held by the head 20, and adjusting the flow rate of gas in each forming unit. In addition, the first forming unit 510 and the second forming unit 520 have been provided with the portions 511 and 521, respectively, which overlap each other in a direction away from the space between the mold 2 and substrate 1. As a result, it will be possible to suppress the vaporization of the uncured imprint material supplied on the substrate and the intrusion of particles into the space between the mold 2 and the substrate 1, thereby allowing an imprint material pattern to be formed highly accurately on the substrate.

Figure 7:
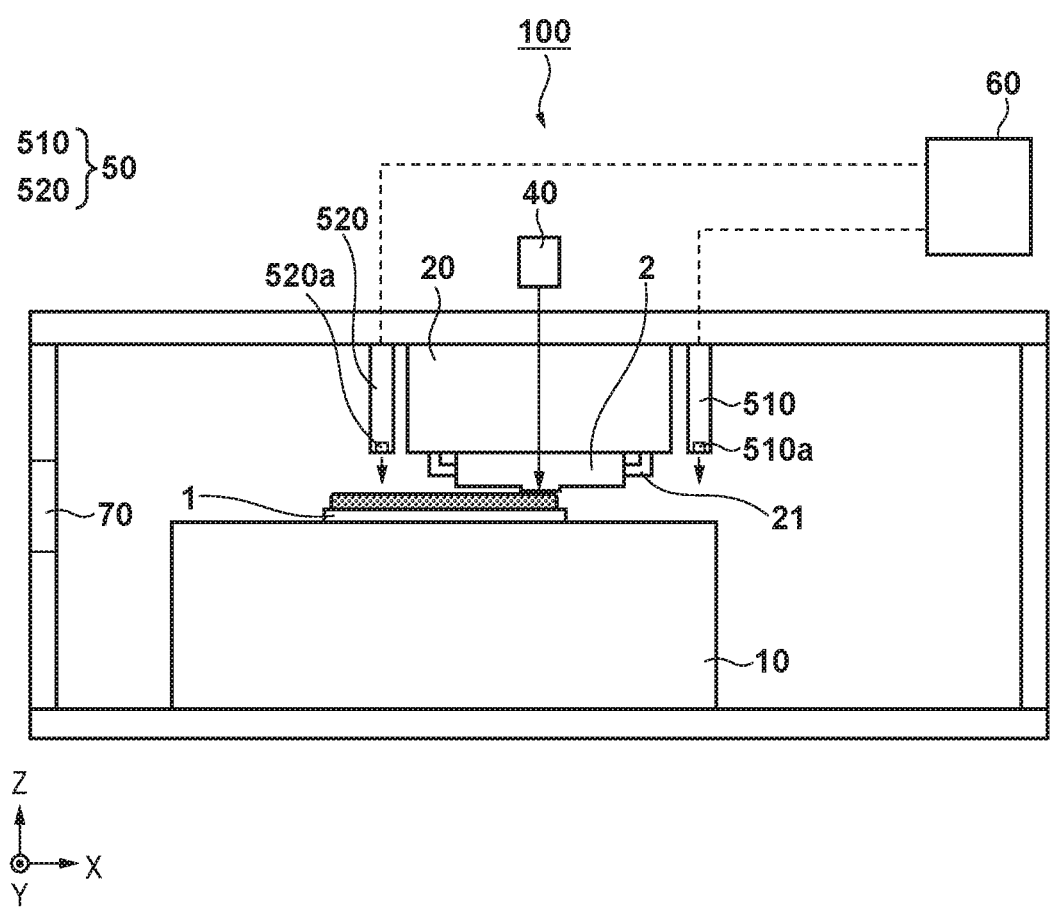
FIG. 7 is a schematic view showing the arrangement of the imprint apparatus as another aspect of the present invention.

Note that as shown in FIG. 7, the imprint apparatus 100 may not include the supplying unit 30 that supplies an uncured imprint material onto a plurality of shot regions on a substrate. In other word, the uncured imprint material may be supplied onto the plurality of shot regions on the substrate by, for example, an external apparatus such as a coater/developer or the like. In this case, the imprint apparatus 100 will include a loading unit 70 for loading the substrate 1 on which the uncured imprint material has been supplied onto the plurality of shot regions. The loading unit 70 can include, for example, a loading port for loading the substrate 1, which has been supplied with the uncured imprint material, into the imprint apparatus 100 and a handover mechanism that hands over, to the substrate stage 10, the substrate 1 which has been loaded from the loading port.

Figure 8A:
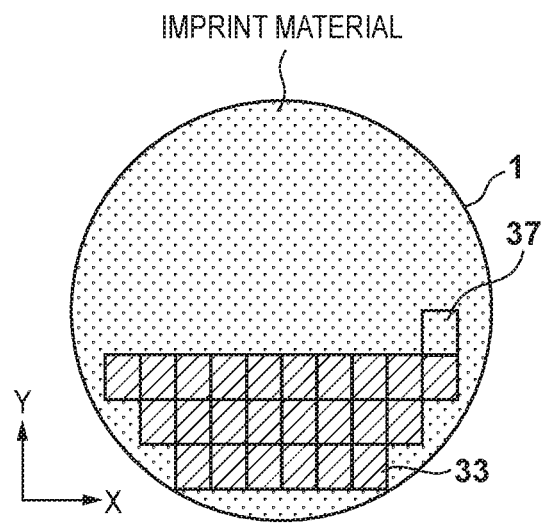
FIGS. 8A to 8D are views for explaining the order of the imprint process.
Figure 8B:
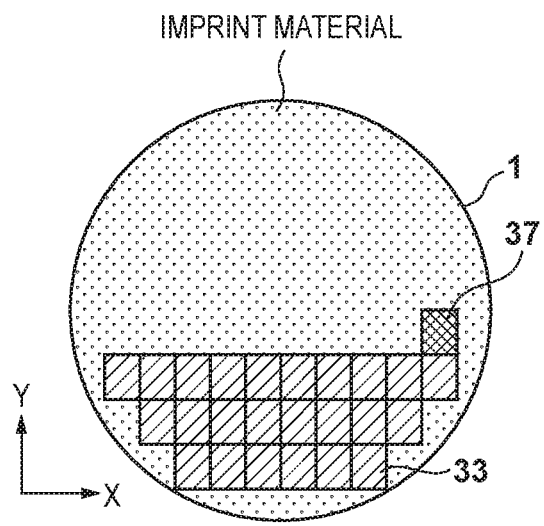
Figure 8C:
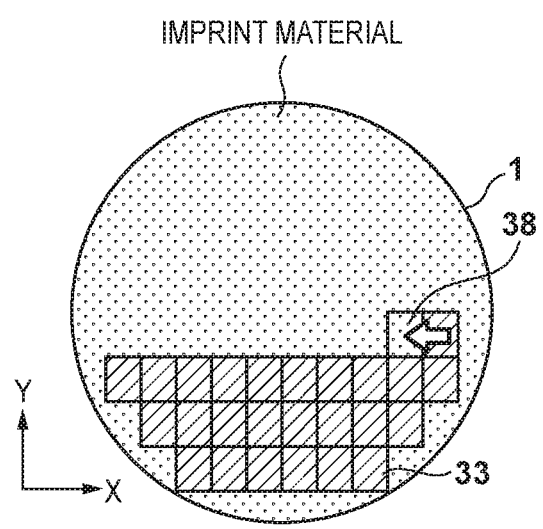
Figure 8D:
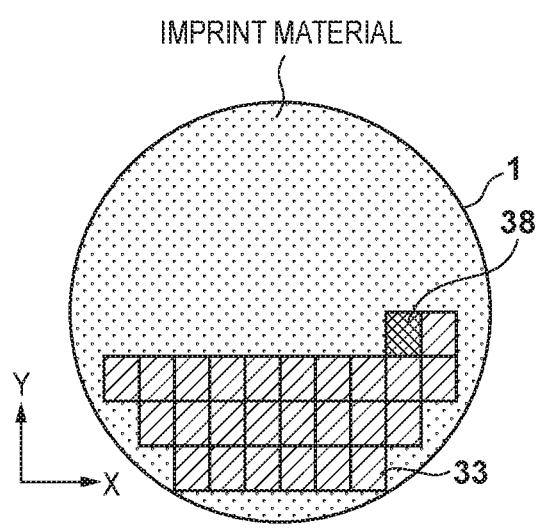

FIGS. 8A, 8B, 8C, and 8D are views for explaining the order of the imprint process performed in the imprint apparatus 100 shown in FIG. 7. A state in which the imprint process is being performed continuously on a plurality of shot regions on the substrate from the −Y direction to the +Y direction and from the +X direction to the −X direction is shown in this case. FIG. 8A shows the substrate 1 in a state before the uncured imprint material is supplied onto the substrate. It shows the substrate 1 in a state before the imprint process is performed on one shot region 37 among the plurality of shot regions on the substrate. Referring to FIG. 8A, it can be seen that the uncured imprint material has been supplied onto the entire surface of the substrate 1 by an external apparatus such as a coater/developer or the like, and the shot regions 33 indicate shot regions on which an imprint material pattern has been formed by undergoing the imprint process. As shown in FIG. 8A, in order to perform the imprint process on the shot region 37, the substrate stage 10 which is holding the substrate 1 is moved so that the shot region 37 will be positioned at the pressing position. FIG. 8B shows the substrate 1 in a state in which the imprint process is being performed on the shot region 37. The mold 2 is pressed against the substrate 1 with the imprint material supplied onto the shot region 37 in between them. As a result, the imprint material supplied on the shot region 37 is formed by the mold 2. FIG. 8C shows the substrate 1 in a state before the imprint process is performed on a shot region 38 which is adjacent to the shot region 37. Since the imprint process is to be performed on the shot region 38 following the shot region 37, the substrate stage 10 which is holding the substrate 1 is moved so that the shot region 38 will be positioned at the pressing position. FIG. 8D shows the substrate 1 in a state in which the imprint process is being performed on the shot region 38. The mold 2 is pressed against the substrate 1 with the imprint material supplied onto the shot region 38 in between them. As a result, the imprint material supplied on the shot region 38 is formed by the mold 2. Although the imprint process order is set to proceed from the −Y direction to the +Y direction and from the +X direction to the −X direction in this embodiment, the present invention is not limited to this. For example, the imprint process order may be set to proceed from the +Y direction to the −Y direction and from the −X direction to the +X direction. The order of the imprint process can be arbitrarily selected in consideration of the productivity and the arrangement of the imprint apparatus 100.

Figure 9A:
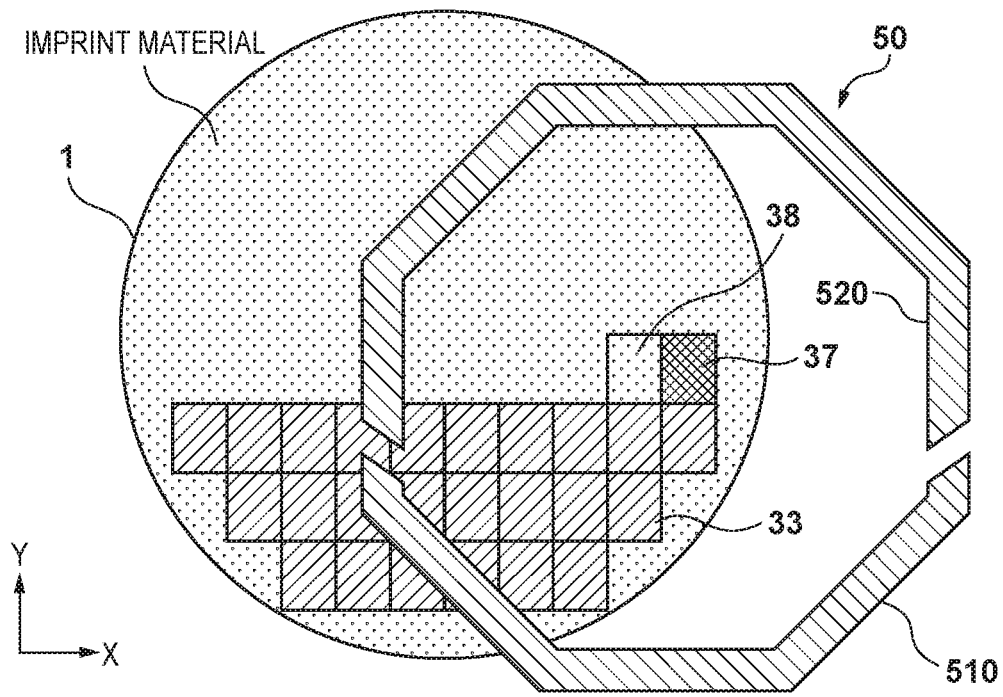
FIGS. 9A and 9B are views showing the positional relationship between each shot region on the substrate and the forming unit.
Figure 9B:
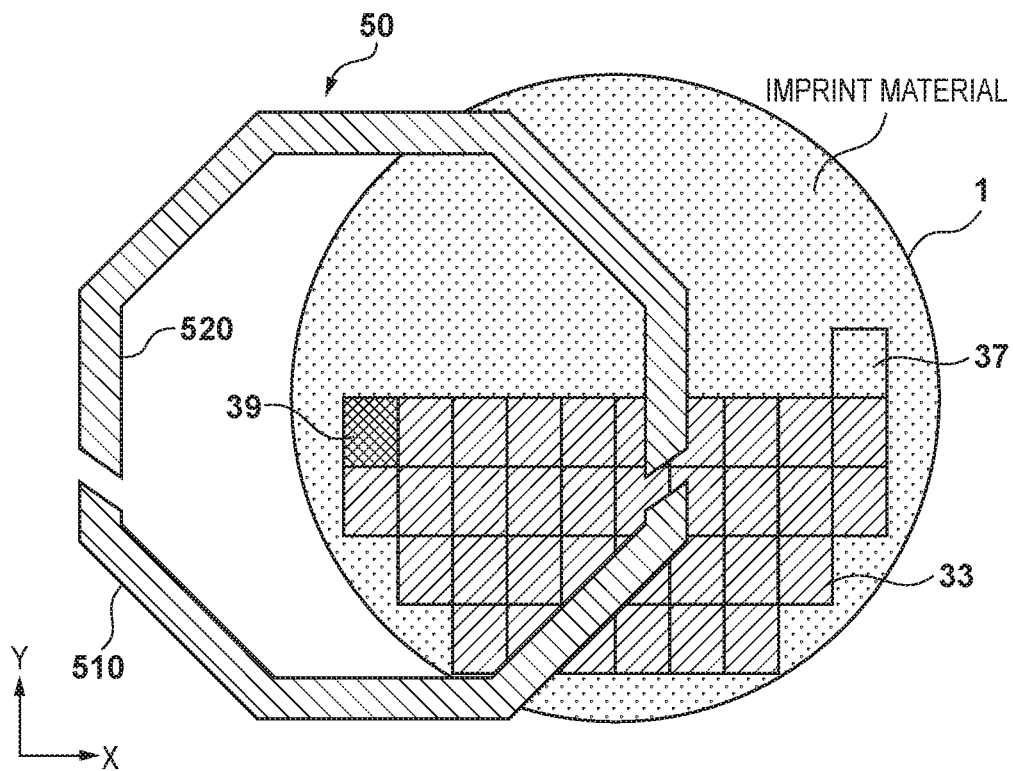

FIGS. 9A and 9B are views showing the positional relationship between each shot region on the substrate and the forming unit 50, that is, the first forming unit 510 and the second forming unit 520 in the imprint process performed in the imprint apparatus 100 shown in FIG. 7. FIG. 9A shows the positional relationship between each shot region on the substrate and the first forming unit 510 and the second forming unit 520 when the imprint process is to be performed on the shot region 37 which is positioned at the edge in the +X direction. FIG. 9B shows the positional relationship between each shot region on the substrate and the first forming unit 510 and the second forming unit 520 when the imprint process is to be performed on a shot region 39 positioned at the edge in the −X direction. Referring to FIGS. 9A and 9B, it can be seen that the second forming unit 520 will be arranged above the uncured imprint material in a case in which the imprint process is to be performed on the shot region 37 on the substrate. In other words, in a state in which the mold 2 is facing the shot region 37 on the substrate, the uncured imprint material supplied on the substrate will be present below the second forming unit 520. Hence, the vaporization of the uncured imprint material supplied on substrate will accelerate during a period from the start to the end of the imprint process because the uncured imprint material will be exposed to the gas blown out from the outlet 520a arranged in the second forming unit 520. Therefore, as described above, the control unit 60 will prevent the acceleration of the vaporization of the uncured imprint material supplied on the substrate by reducing (restricting) the flow rate of the gas blown out from the outlet 520a arranged in the second forming unit 520. As a result, the vaporization of the uncured imprint material supplied on the substrate can be suppressed.

Figure 10A:
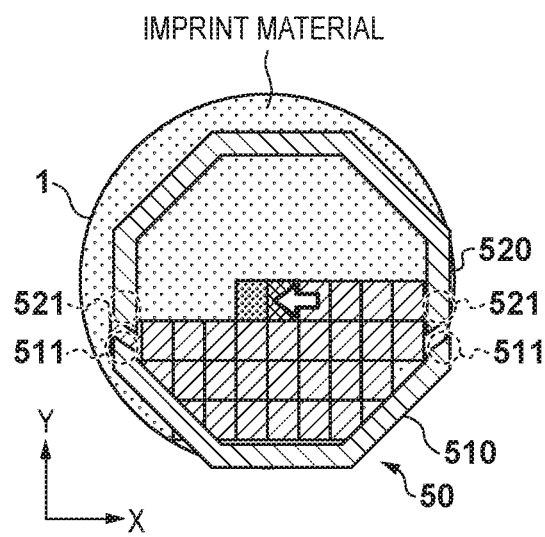
FIGS. 10A to 10D are views for explaining the arrangement and the shape of the forming unit.
Figure 10B:
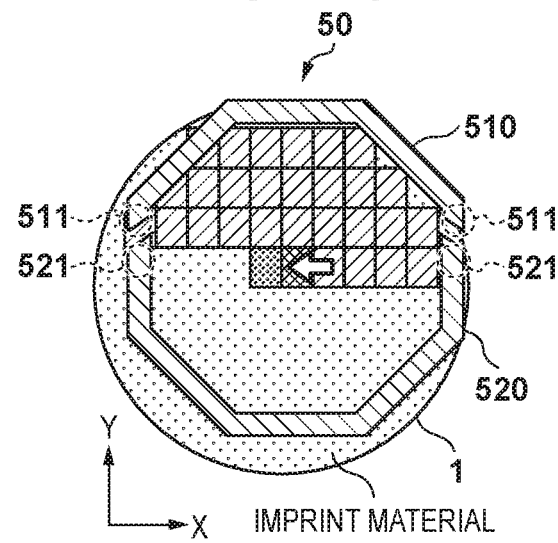
Figure 10C:
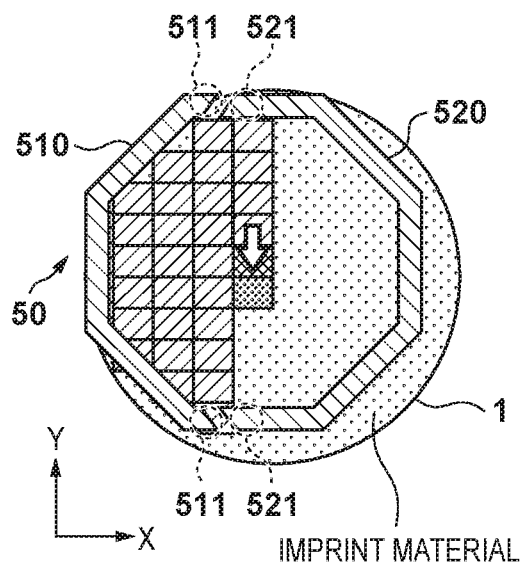
Figure 10D:
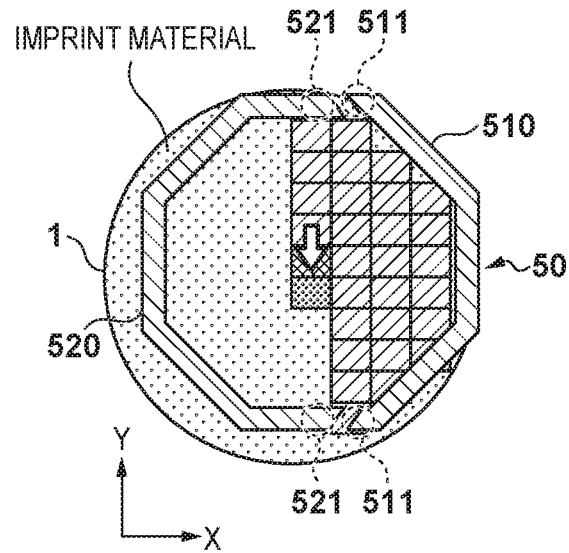

The shape and the arrangement of the forming unit 50 of the imprint apparatus 100 shown in FIG. 7 will be described with reference to FIGS. 10A, 10B, 10C, and 10D. As shown in FIGS. 10A to 10D, the first forming unit 510 and the second forming unit 520 are formed by dividing an almost annular-shaped member so as to include the portions 511 and 521, respectively, which overlap each other. FIG. 10A shows the arrangement of the forming unit 50 that is suitable for a case in which the imprint process is to be performed continuously on the plurality of shot regions on the substrate in the order from the −Y direction to the +Y direction and from the +X direction to the −X direction. FIG. 10B shows the arrangement of the forming unit 50 that is suitable for a case in which the imprint process is to be performed continuously on the plurality of shot regions on the substrate in the order from the +Y direction to the −Y direction and from the +X direction to the −X direction. FIG. 10C shows the arrangement of the forming unit 50 that is suitable for a case in which the imprint process is to be performed continuously on the plurality of shot regions on the substrate in the order from the +Y direction to the −Y direction and from the −X direction to the +X direction. FIG. 10D shows the arrangement of the forming unit 50 that is suitable for a case in which the imprint process is to be performed continuously on the plurality of shot regions on the substrate in the order from the +Y direction to the −Y direction and from the +X direction to the −X direction.

The imprint apparatus 100 shown in FIG. 7 can also similarly suppress the vaporization of the uncured imprint material supplied on the substrate and the intrusion of particles into the space between the mold 2 and the substrate 1, thereby allowing an imprint material pattern to be formed highly accurately on the substrate.

The pattern of a cured product formed using the imprint apparatus 100 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 11A:
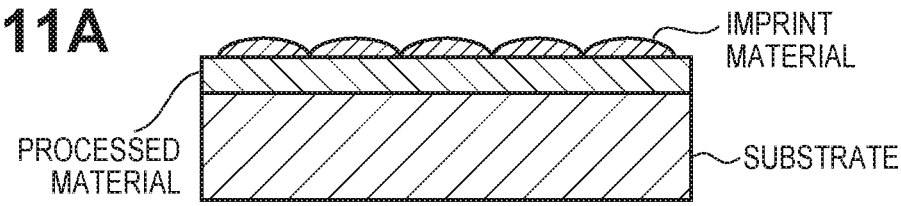
FIGS. 11A to 11F are views for explaining an article manufacturing method.

An article manufacturing method will be described in detail next. As shown in FIG. 11A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 11B:
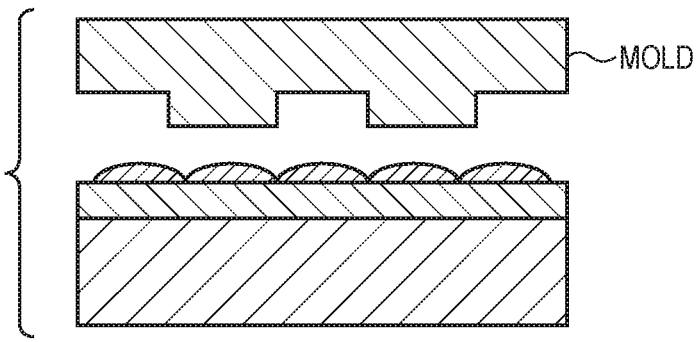
Figure 11C:
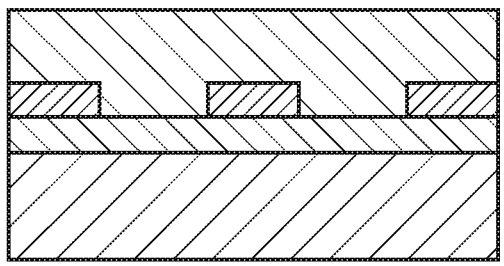

As shown in FIG. 11B, a side of the mold for imprint with an uneven pattern is directed to and caused to face the imprint material on the substrate. As shown in FIG. 11C, the substrate to which the imprint material is applied is brought into contact with the mold, and a pressure is applied. The gap between the mold and the processed material is filled with the imprint material. When the imprint material is irradiated with light serving as curing energy through the mold in this state, the imprint material is cured.

Figure 11D:
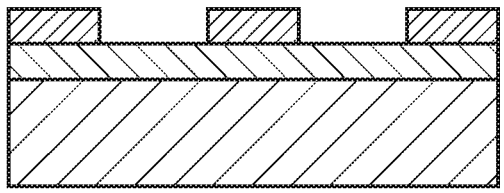

As shown in FIG. 11D, after the imprint material is cured, the mold is separated from the substrate. Thus, the pattern of the cured product of the imprint material is formed on the substrate. In the pattern of the cured product, the concave portion of the mold corresponds to the convex portion of the cured product, and the convex portion of the mold corresponds to the concave portion of the cured product. That is, the uneven pattern of the mold is transferred to the imprint material.

Figure 11E:
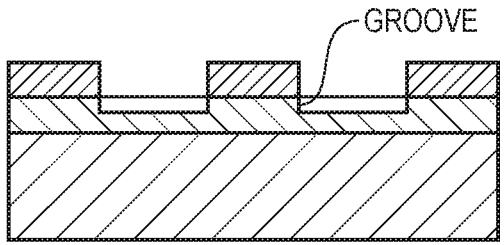
Figure 11F:
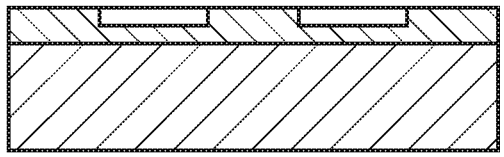

As shown in FIG. 11E, when etching is performed using the pattern of the cured product as an etching resistant mask, a portion of the surface of the processed material where the cured product does not exist or remains thin is removed to form a groove. As shown in FIG. 11F, when the pattern of the cured product is removed, an article with the grooves formed in the surface of the processed material can be obtained. Here, the pattern of the cured product is removed. However, instead of processing or removing the pattern of the cured product, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2019-168731 filed on Sep. 17, 2019, which is hereby incorporated by reference herein in its entirety.

What is claimed is:

1. An imprint apparatus for performing an imprint process which forms an imprint material pattern on a substrate by using a mold, comprising:

one or more memories storing instructions; and
one or more processors executing the instructions to cause the imprint apparatus to function as:
   a forming unit arranged around the mold and configured to form an air curtain that shields a space between the mold and the substrate; and
   a control unit configured to control the forming unit when the imprint process is performed continuously on a plurality of shot regions on the substrate supplied with an uncured imprint material,
wherein the forming unit includes a first forming unit and a second forming unit, and each of the first forming unit and the second forming unit includes an outlet which blows out gas for forming the air curtain from a side of the mold to a side of the substrate,
the first forming unit and the second forming unit form the air curtain that shields the space between the mold and the substrate by blowing out the gas independently of each other from each outlet, and
the first forming unit and the second forming unit include portions, respectively, which overlap each other in a direction away from the space in a plane parallel to a pattern surface of the mold.

2. The apparatus according to claim 1, wherein the control unit individually controls a flow rate of the gas blown out from the outlet arranged in the first forming unit and a flow rate of the gas blown out from the outlet arranged in the second forming unit.

3. The apparatus according to claim 1, wherein in a case in which the uncured imprint material is present below one forming unit among the first forming unit and the second forming unit in a state in which the mold is facing at least one shot region of the plurality of shot regions in the imprint process, the control unit controls the one forming unit so that the flow rate of the gas blown out from the outlet arranged in the one forming unit will be a second flow rate which is lower than a first flow rate of the gas blown out from the outlet arranged in each of the first forming unit and the second forming unit in a case in which the uncured imprint material is not present below the first forming unit and the second forming unit.

4. The apparatus according to claim 3, wherein the control unit controls the forming unit so that a total sum of the flow rate of the gas blown out from the outlet arranged in the first forming unit and the flow rate of the gas blown out from the outlet arranged in the second forming unit will be constant.

5. The apparatus according to claim 1, wherein the first forming unit has a shape in which a portion has been cut out from a shape surrounding the mold so as to include an opening which partially opens to the mold in the plane parallel to the pattern surface of the mold, and
   the second forming unit has a shape which covers the opening in the plane parallel to the pattern surface of the mold.

6. The apparatus according to claim 5, wherein the second forming unit includes a portion to be inserted into the opening.

7. The apparatus according to claim 6, wherein the second forming unit has a convex shape in the plane parallel to the pattern surface of the mold.

8. The apparatus according to claim 6, wherein the second forming unit has an H shape in the plane parallel to the pattern surface of the mold.

9. The apparatus according to claim 5, wherein the second forming unit has an I shape in the plane parallel to the pattern surface of the mold.

10. The apparatus according to claim 5, wherein the second forming unit has a tapered shape in the plane parallel to the pattern surface of the mold.

11. The apparatus according to claim 1, wherein the forming unit includes a third forming unit and a fourth forming unit, and each of the third forming unit and the fourth forming unit includes the outlet which blows out the gas for forming the air curtain from the side of the mold to the side of the substrate,
   the third forming unit and the fourth forming unit form the air curtain that shields the space between the mold and the substrate by blowing out the gas independently of each other from each outlet,
   the first forming unit and the fourth forming unit include the portions, respectively, which overlap each other in the direction away from the space in the plane parallel to the pattern surface of the mold,
   the second forming unit and the third forming unit include the portions, respectively, which overlap each other in the direction away from the space in the plane parallel to the pattern surface of the mold, and
   the third forming unit and the fourth forming unit include the portions, respectively, which overlap each other in the direction away from the space in the plane parallel to the pattern surface of the mold.

12. The apparatus according to claim 11, wherein the first forming unit and the third forming unit are arranged so as to sandwich the mold therebetween and have the same shape in the plane parallel to the pattern surface of the mold, and
   the second forming unit and the fourth forming unit are arranged so as to sandwich the mold therebetween and have the same shape in the plane parallel to the pattern surface of the mold.

13. The apparatus according to claim 1, wherein the forming unit includes a third forming unit, a fourth forming unit, a fifth forming unit, a sixth forming unit, a seventh forming unit, and an eighth forming unit, and each of the third forming unit, the fourth forming unit, the fifth forming unit, the sixth forming unit, the seventh forming unit, and the eighth forming unit includes the outlet which blows out the gas for forming the air curtain from the side of the mold to the side of the substrate,
   the third forming unit, the fourth forming unit, the fifth forming unit, sixth forming unit, the seventh forming unit, and the eighth forming unit form the air curtain that shields the space between the mold and the substrate by blowing out the gas independently of each other from the respective outlet,
   the first forming unit and the eighth forming unit include the portions, respectively, which overlap each other in the direction away from the space in the plane parallel to the pattern surface of the mold,
   the second forming unit and the third forming unit include the portions, respectively, which overlap each other in the direction away from the space in the plane parallel to the pattern surface of the mold,
   the third forming unit and the fourth forming unit include the portions, respectively, which overlap each other in the direction away from the space in the plane parallel to the pattern surface of the mold,
   the fourth forming unit and the fifth forming unit include the portions, respectively, which overlap each other in the direction away from the space,
   the fifth forming unit and the sixth forming unit include the portions, respectively, which overlap each other in the direction away from the space in the plane parallel to the pattern surface of the mold, the sixth forming unit and the seventh forming unit include the portions, respectively, which overlap each other in the direction away from the space in the plane parallel to the pattern surface of the mold, and the seventh forming unit and the eighth forming unit include the portions, respectively, which overlap each other in the direction away from the space in the plane parallel to the pattern surface of the mold.

14. The apparatus according to claim 13, wherein the first forming unit, the third forming unit, the fifth forming unit, and the seventh forming unit have the same shape in the plane parallel to the pattern surface of the mold, the second forming unit, the fourth forming unit, the sixth forming unit, and the eighth forming unit have the same shape in the plane parallel to the pattern surface of the mold, and the first forming unit and the fifth forming unit are arranged so as to sandwich the mold therebetween, the second forming unit and the sixth forming unit are arranged so as to sandwich the mold therebetween, the third forming unit and the seventh forming unit are arranged so as to sandwich the mold therebetween, and the fourth forming unit and the eighth forming unit are arranged so as to sandwich the mold therebetween.

15. An imprint apparatus for performing an imprint process which forms an imprint material pattern on a substrate by using a mold, comprising:

one or more memories storing instructions; and one or more processors executing the instructions to cause the imprint apparatus to function as:

a forming unit arranged around the mold and configured to form an air current that surrounds a space between the mold and the substrate; and a control unit configured to control the forming unit when the imprint process is performed continuously on a plurality of shot regions on the substrate supplied with an uncured imprint material, wherein the forming unit includes a first forming unit and a second forming unit which are independent of each other, and each of the first forming unit and the second forming unit includes an outlet which blows out gas for forming the air current from a side of the mold to a side of the substrate, the first forming unit and the second forming unit include portions, respectively, which overlap each other in a direction away from the space in a plane parallel to a pattern surface of the mold, in a case in which the uncured imprint material is present below one forming unit among the first forming unit and the second forming unit in a state in which the mold is facing at least one shot region of the plurality of shot regions in the imprint process, the control unit controls the one forming unit so that a flow rate of the gas blown out from the outlet arranged in the one forming unit will be a second flow rate which is lower than a first flow rate of the gas blown out from the outlet arranged in each of the first forming unit and the second forming unit in a case in which the uncured imprint material is not present below the first forming unit and the second forming unit, and the control unit controls the forming unit so that a total sum of the flow rate of the gas blown out from the outlet arranged in the first forming unit and the flow rate of the gas blown out from the outlet arranged in the second forming unit will be constant.

16. An imprint apparatus for performing an imprint process which forms an imprint material pattern on a substrate by using a mold, comprising:

one or more memories storing instructions; and one or more processors executing the instructions to cause the imprint apparatus to function as:

a forming unit arranged around the mold and configured to form an air current that surrounds a space between the mold and the substrate; and a control unit configured to control the forming unit when the imprint process is performed continuously on a plurality of shot regions on the substrate supplied with an uncured imprint material, wherein the forming unit includes a first forming unit and a second forming unit which are independent of each other, and each of the first forming unit and the second forming unit includes an outlet which blows out gas for forming the air current from a side of the mold to a side of the substrate, the first forming unit and the second forming unit include portions, respectively, which overlap each other in a direction away from the space in a plane parallel to a pattern surface of the mold, the first forming unit has a shape in which a portion has been cut out from a shape surrounding the mold so as to include an opening which partially opens to the mold in the plane parallel to the pattern surface of the mold, the second forming unit has a shape which covers the opening in the plane parallel to the pattern surface of the mold, and the second forming unit includes a portion to be inserted into the opening.

17. An imprint apparatus for performing an imprint process which forms an imprint material pattern on a substrate by using a mold, comprising:

one or more memories storing instructions; and one or more processors executing the instructions to cause the imprint apparatus to function as:

a forming unit arranged around the mold and configured to form an air current that surrounds a space between the mold and the substrate; and a control unit configured to control the forming unit when the imprint process is performed continuously on a plurality of shot regions on the substrate supplied with an uncured imprint material, wherein the forming unit includes a first forming unit and a second forming unit which are independent of each other, and each of the first forming unit and the second forming unit includes an outlet which blows out gas for forming the air current from a side of the mold to a side of the substrate, the first forming unit and the second forming unit include portions, respectively, which overlap each other in a direction away from the space in a plane parallel to a pattern surface of the mold, the first forming unit has a shape in which a portion has been cut out from a shape surrounding the mold so as to include an opening which partially opens to the mold in the plane parallel to the pattern surface of the mold, the second forming unit has a shape which covers the opening in the plane parallel to the pattern surface of the mold, and the second forming unit has an I shape in the plane parallel to the pattern surface of the mold.

18. An imprint apparatus for performing an imprint process which forms an imprint material pattern on a substrate by using a mold, comprising:

one or more memories storing instructions; and
one or more processors executing the instructions to cause the imprint apparatus to function as:
a forming unit arranged around the mold and configured to form an air current that surrounds a space between the mold and the substrate; and
a control unit configured to control the forming unit when the imprint process is performed continuously on a plurality of shot regions on the substrate supplied with an uncured imprint material,
wherein the forming unit includes a first forming unit and a second forming unit which are independent of each other, and each of the first forming unit and the second forming unit includes an outlet which blows out gas for forming the air current from a side of the mold to a side of the substrate,
the first forming unit and the second forming unit include portions, respectively, which overlap each other in a direction away from the space in a plane parallel to a pattern surface of the mold,
the first forming unit has a shape in which a portion has been cut out from a shape surrounding the mold so as to include an opening which partially opens to the mold in the plane parallel to the pattern surface of the mold,
the second forming unit has a shape which covers the opening in the plane parallel to the pattern surface of the mold, and
the second forming unit has a tapered shape in the plane parallel to the pattern surface of the mold.

19. An imprint apparatus for performing an imprint process which forms an imprint material pattern on a substrate by using a mold, comprising:
one or more memories storing instructions; and
one or more processors executing the instructions to cause the imprint apparatus to function as:
a forming unit arranged around the mold and configured to form an air current that surrounds a space between the mold and the substrate; and
a control unit configured to control the forming unit when the imprint process is performed continuously on a plurality of shot regions on the substrate supplied with an uncured imprint material,
wherein the forming unit includes a first forming unit, a second forming unit, a third forming unit and a fourth forming unit which are independent of each other, and each of the first forming unit, the second forming unit, the third forming unit and the fourth forming unit includes an outlet which blows out gas for forming the air current from a side of the mold to a side of the substrate,
the first forming unit and the second forming unit include portions, respectively, which overlap each other in a direction away from the space in a plane parallel to a pattern surface of the mold,
the first forming unit and the fourth forming unit include the portions, respectively, which overlap each other in the direction away from the space in the plane parallel to the pattern surface of the mold,
the second forming unit and the third forming unit include the portions, respectively, which overlap each other in the direction away from the space in the plane parallel to the pattern surface of the mold, and
the third forming unit and the fourth forming unit include the portions, respectively, which overlap each other in the direction away from the space in the plane parallel to the pattern surface of the mold.

20. An article manufacturing method comprising:
forming a pattern on a substrate using an imprint apparatus defined in claim 1;
processing the substrate on which the pattern is formed in the forming; and
manufacturing an article from the processed substrate.

* * * * *